United States Patent
Liu et al.

[11] Patent Number: 6,150,272
[45] Date of Patent: Nov. 21, 2000

[54] METHOD FOR MAKING METAL PLUG CONTACTS AND METAL LINES IN AN INSULATING LAYER BY CHEMICAL/MECHANICAL POLISHING THAT REDUCES POLISHING-INDUCED DAMAGE

[75] Inventors: Chung-Shi Liu; Chen-Hua Yu, both of Hsin-Chu, Taiwan

[73] Assignee: Taiwan Semiconductor Manufacturing Company, Hsin-Chu, Taiwan

[21] Appl. No.: 09/192,456

[22] Filed: Nov. 16, 1998

[51] Int. Cl.$^7$ .................... H01L 21/302; H01L 21/461
[52] U.S. Cl. ............................................. 438/692
[58] Field of Search .................... 438/626, 627, 438/628, 633, 634, 637, 648, 691, 692, 693, 695, 705, 710, 725, 745

[56] References Cited

U.S. PATENT DOCUMENTS

| | | | |
|---|---|---|---|
| 5,231,054 | 7/1993 | Kosugi | 437/192 |
| 5,371,047 | 12/1994 | Greco et al. | 437/238 |
| 5,578,523 | 11/1996 | Fiordalice et al. | 437/190 |
| 5,897,375 | 4/1999 | Watts et al. | 438/691 |
| 5,932,487 | 1/2000 | Lou et al. | 438/692 |
| 5,960,316 | 9/1999 | Bai | 438/633 |
| 5,990,011 | 11/1999 | McTeer | 438/692 |
| 6,012,469 | 1/2000 | Li et al. | 438/693 |

*Primary Examiner*—Benjamin L. Utech
*Assistant Examiner*—Duy-Vu Deo
*Attorney, Agent, or Firm*—George O. Saile; Stephen B. Ackerman

[57] ABSTRACT

A method for making metal plugs in via holes and interconnections by an improved chem/mech polishing process using an organic protective layer is achieved. After devices are formed on a substrate which includes a patterned conducting layer, a low-k insulating layer is deposited and planarized. An organic protective layer, such as a polymer, is deposited, and contact holes are etched in the polymer and insulating layers. A thin Ti/TiN barrier layer is deposited and a tungsten metal is deposited sufficiently thick to fill the contact holes. The tungsten metal and barrier layers are chem/mech polished back to form metal plugs, while the protective layer protects the insulating layer from CMP scratching and other CMP defects. The organic protective layer is easily removed using plasma ashing and other cleaning steps. The method is also applicable to forming metal interconnections. Trenches are etched, over and to the metal plugs, in an insulating layer having an organic protective layer. A barrier layer is deposited and a highly conductive metal, such as AlCu alloy or Cu, is deposited and are chem/mech polished back to the protective layer. The protective layer is then removed to form the metal interconnections in the insulator.

28 Claims, 3 Drawing Sheets

METHOD FOR MAKING METAL PLUG CONTACTS AND METAL LINES IN AN INSULATING LAYER BY CHEMICAL/ MECHANICAL POLISHING THAT REDUCES POLISHING-INDUCED DAMAGE

BACKGROUND OF THE INVENTION (1) Field of the Invention

The present invention relates to a method for making recessed metal patterns in an insulator for metal plugs and interconnecting lines on integrated circuits using chemical/ mechanical polishing (CMP), commonly referred to as the damascene process. More particularly, the invention uses a sacrificial thin organic layer to protect the underlying insulating surface from CMP-induced defects during polishing. Although the method is used to make metal plugs and lines, it is also applicable to the dual damascene process.

(2) Description of the Prior Art

The packing density of devices on integrated circuits has dramatically increased on ultra-large scale integrated (ULSI) circuits due to advances in semiconductor processing, such as the use of high-resolution photolithography and anisotropic plasma etching. In this sub-micron technology the allowed packing density of devices on an integrated circuit is strongly dependent on the metal interconnection density. As future design rules are more aggressively scaled down, for example, down to 0.18 to 0.1 micrometers (um), more levels of metal are required to effectively interconnect the high density of discrete devices on the chip.

However, as the number of metal levels increases and the topography gets rougher, it becomes increasingly difficult to pattern the metal levels. This results because a shallow depth of focus (DOF) is required when exposing the photoresist, and the rough topography can result in distorted photoresist images. Another problem is that it is difficult to etch sub-micron feature sizes in the metal layers using anisotropic etching without leaving residue in the underlying rough topography.

One method of circumventing these problems is to provide an insulator with a planar surface and to use a damascene process in which recesses are etched in the insulator and a metal is deposited and chem/mech polished back to provide metal interconnections in the recesses and resulting in a planar surface for the next level of processing. Unfortunately, the CMP results in polishing-induced defects, such as scratches that can adversely affect the reliability of the integrated circuit.

Several methods of making these recessed interconnections by chem/mech polishing are described in the literature. A general method of using low dielectric insulators for ULSI interconnections by a damascene process and a dual damascene process is described in the paper entitled "Low-k Dielectric Integration Cost Modelling," by Ed Korczynski in Solid State Technology, Oct. 1997, pages 123–128. Other methods for making planar metal/insulating structures are described. Fiordalice et al. in U.S. Pat. No. 5,578,523 describe a method using an aluminum nitride layer between a metal layer and an underlying dielectric layer to prevent dishing or cusping of the interconnection when the metal is polished back. Another method is described in U.S. Pat. No. 5,262,354 to Cote et al. in which a hard metal, such as tungsten, is formed over a low-resistivity soft metal to protect the soft metal from scratches and corrosion when the metals are polished back to form a planar surface. Gambino et al. in U.S. Pat. No. 5,573,633 teach a method for forming metal plugs in via holes in a planar insulating layer using a thick polysilicon layer as a chem/mech polish stop layer. A short chem/mech polish is then used to remove the polysilicon.

There is still a need in the semiconductor industry to provide a chem/mech polishing method that avoids scratches and other defects and corrosion of the underlying insulating layers when the metals are polished back to form plugs and metal interconnections recessed in the insulating layers such as by the damascene process.

SUMMARY OF THE INVENTION

It is a principal object of this invention to provide a method for making interlevel metal connections and metal plugs in contact and via holes for interconnecting discrete semiconductor devices on a substrate using CMP.

It is another object of this invention to provide a CMP process using a protective layer for making the metal plugs and interconnections that reduces CMP damage on the surface when using the damascene or dual damascene process.

The method for making the metal plugs and electrical interconnections using CMP with an organic protective layer to reduce the polishing damage is described. The method is described for making metal plugs in via holes to an underlying conducting layer, such as to one of the metal interconnections, it should be understood that the method can also be used to make metal plugs in contact openings to the substrate and to patterned polysilicon layers that form portions of devices, such as field effect transistors (FETs), bit lines, and the like.

The method for making metal plugs in an insulating layer by chemical/mechanical polishing begins by providing a semiconductor substrate having a patterned conducting layer, such as a doped polysilicon, polycide layer, or metal layer on its surface. A planar insulating layer is formed over the patterned conducting layer. The insulating layer is typically silicon oxide ($SiO_2$) or a low-dielectric oxide such as fluorine-doped silicon glass (FSG). The insulating layer is made planar, for example, by chem/mech polishing.

Now, by the method of this invention, an organic protective layer, such as a fluorine-doped polymer, is deposited on the insulating layer by spin coating. Using a photoresist mask, openings for metal plugs are etched in the organic protective layer and in the insulating layer to the underlying conducting layer. A conformal barrier/adhesion layer, such as titanium/titanium nitride (Ti/TiN) is deposited on the organic protective layer and in the openings to make electrical contact to the underlying conducting layer. Next, a metal layer, such as tungsten (W) is deposited and is sufficiently thick to fill the openings and to form an essentially planar surface over the openings. The metal layer and the barrier/adhesion layer are then chemically/mechanically polished back to the organic protective layer. The organic protective layer protects the insulating layer from polishing-induced defects, such as microscratches. The organic protective layer is then selectively removed over the insulating layer to complete the metal plugs in the openings, resulting in metal plugs coplanar with the surface of the insulating layer. The organic protective layer is removed, for example, by plasma ashing in oxygen ($O_2$) and using a wet etch.

The method of this invention using an organic protective layer is also applicable for making interconnecting metal lines for multilevel metal structures. The method is similar to the process for making metal plugs. Another insulating layer, such as FSG, is deposited over the metal plugs. Another organic protective layer, such as a fluorine-doped polymer, is deposited by spin coating. A photoresist mask is used to etch trenches or recesses in the protective layer and the insulating layer. The trenches extend over the metal plugs. Next, a barrier layer, such as Ti/TiN or tantalum/tantalum nitride (Ta/TaN), is deposited to make electrical contact to the metal plugs in the trenches. A metal layer having high electrical conductivity, such as aluminum/copper alloy or pure copper, is deposited sufficient to fill the trenches and to form an essentially planar surface over the trenches. The metal layer is then chem/mech polished back to the organic protective layer to form the interconnecting metal lines essentially planar with the surface of the insulating layer. The organic protective layer that prevents CMP-induced damage to the insulating layer is removed by plasma ashing in $O_2$ and wet cleaning.

The above processes for making the metal plugs and interconnecting lines can be repeated to complete the wiring for the integrated circuit. Although the method is shown for a single damascene process for each level, it should be understood by those skilled in the art that the process using this organic protective layer can also be applied to the dual damascene process in which the metal plug openings and the trenches for the interconnecting lines are etched before filling with metal and chem/mech polishing.

BRIEF DESCRIPTION OF THE DRAWINGS

The objects and other advantages of this invention are best understood with reference to the preferred embodiment when read in conjunction with the following drawings.

DESCRIPTION OF THE PREFERRED EMBODIMENT

The present invention relates to a method for forming metal plugs and electrical interconnections using an organic protective layer that reduces polishing-induced damage (defects). Although the method is described for a single metal plug contact and an interconnecting metal line, it should be well understood by those skilled in the art that the process can be repeated to complete the multilevel interconnections on an integrated circuit.

Figure 1:
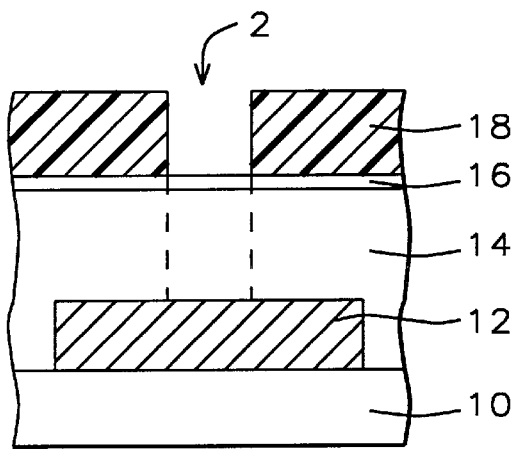
FIGS. 1 through 5 are schematic cross-sectional views showing the sequence of process steps, by the method of this invention, for making metal plug contacts by chem/mech polishing using an organic protective layer.

Referring now to FIG. 1, the method for making metal plugs in an insulating layer by chemical/mechanical polishing begins by providing a semiconductor substrate 10. Typically the substrate is composed of a single-crystal silicon and has semiconductor devices formed therein, such as field effect transistors (FETs), bipolars, and the like, which are not explicitly shown in the drawings. After electrically insulating the devices on the substrate 10, a patterned conducting layer 12, such as a doped polysilicon, polycide layer, or metal layer is formed on the substrate surface to form portions of the devices and/or local interconnections.

Still referring to FIG. 1, a planar insulating layer 14 is formed over the patterned conducting layer 12 to insulate the underlying devices and to provide a planar surface for forming multilevels of metal interconnections. Typically, the insulating layer 14 is a silicon oxide ($SiO_2$) and is deposited by low-pressure chemical vapor deposition (LPCVD) using tetraethosiloxane (TEOS) or TEOS/ozone as the reactant gas. Preferably the insulating layer 14 is a low-dielectric oxide-based insulator. For example, a fluorine-doped silicon glass (FSG) can be used, and is deposited by plasma-enhanced CVD or in a high-density plasma system. Other low-dielectric CVD films, such as SiOC, fluorinated amorphous carbon (alpha-CF), and the like can be used as insulating layer 14. The $SiO_2$ or FSG insulating layer 14 is then planarized by chemical/mechanical polishing to have a thickness of between about 5000 and 10000 Angstroms over the electrically conducting layer 12.

Continuing with FIG. 1, by the method of this invention, a sacrificial thin organic protective layer 16 is deposited on the planar insulating layer 14. Layer 16 is later used during chem/mech polishing to protect the underlying insulating layer 14 from polishing damage, such as microscratches. The protective layer 16 is preferably composed of a low-dielectric-constant fluorine-doped polymer, and is deposited by spin coating to a thickness of between about 500 and 1000 Angstroms. For example, one type of polymer protective layer is FLARE(™), manufactured by Allied Signal of U.S.A., and is synthesized from perfluorobiphenyl with aromatic bisphenols, which results in a fluorine-doped polymer. The polymer layer 16 is then cured at a temperature of between about 350 and 420° C. for about 20 to 60 minutes. Alternatively, layer 16 can be a poly(arylene) ether polymer, such as PAE-2 manufactured by Schumacher of U.S.A.

Referring still to FIG. 1, a photoresist mask 18, having openings is formed on the protective layer 16 for etching contact openings 2 in layers 16 and 14 to the conducting layer 12 for metal plugs. The etching is carried out using anisotropic plasma etching in a high-density plasma (HDP) etcher, and using an etchant gas such as carbon tetrafluoride ($CF_4$), trifluoromethane ($CHF_3$), methylfluoride ($CH_3F$) and nitrogen ($N_2$), as indicated by the dashed lines 4 in FIG. 1.

Figure 2:
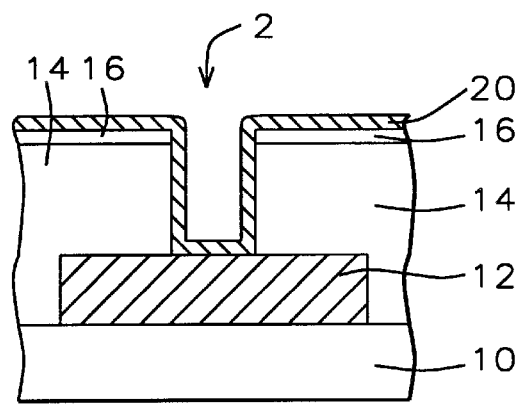

Referring to FIG. 2, the photoresist mask is removed selectively to the organic protective layer 16, without attacking the low-dielectric polymer layer 16, using a solvent such as NOE, manufactured by Advanced Chemical Systems, Inc., U.S.A., or ACT-690, manufactured by Ashland Chemical of U.S.A.

Still referring to FIG. 2, a conformal barrier/adhesion layer 20, preferably titanium/titanium nitride (Ti/TiN) is deposited on the organic protective layer 16 and in the openings 2 to make electrical contact to the underlying conducting layer 12. The Ti is preferably deposited by physical vapor deposition (PVD), for example, by sputter deposition from a Ti target. Alternatively, the Ti can be deposited by CVD using a reactant gas such as titanium tetrachloride ($TiCl_4$). The Ti is deposited to a thickness of between about 100 and 400 Angstroms. The TiN is formed during sputter deposition by including a nitrogen ambient, and is deposited to a thickness of between about 100 and 1000 Angstroms.

Figure 3:
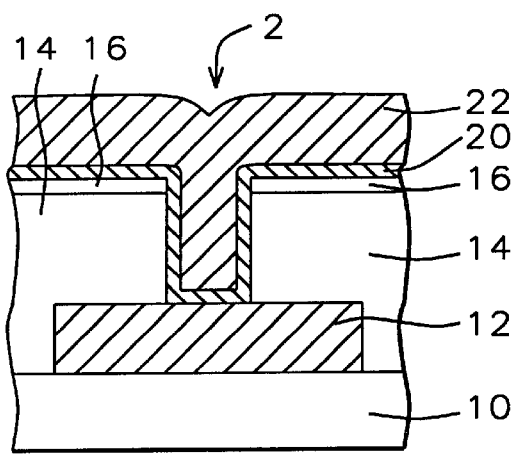

Referring to FIG. 3, a metal layer 22 is deposited. Layer 22 is preferably tungsten (W) and is deposited by CVD using a reactant gas such as tungsten hexafluoride ($WF_6$). The tungsten layer 22 is deposited sufficiently thick to fill the openings 2 and to form an essentially planar surface over the openings. Typically the W is deposited to a thickness of between about 3000 and 6000 Angstroms.

Figure 4:
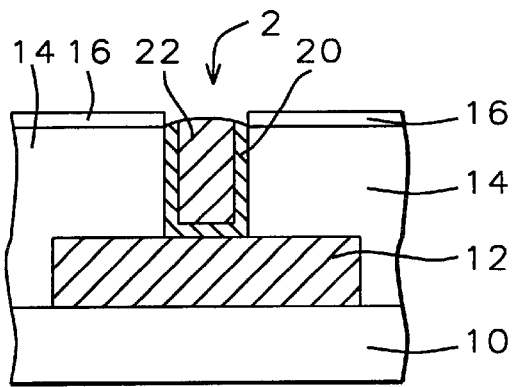

Referring to FIG. 4, the metal layer 22 and the barrier/adhesion layer 20 are then chemically/mechanically polished back to the organic protective layer 16 to form the tungsten plugs 22 in the contact openings 2. The organic protective layer 16 protects the insulating layer 14 from polishing-induced defects, such as microscratches. The chem/mech polishing is carried out using an appropriate polishing pad and slurry, for example, one can use a slurry composed of aluminum oxide ($Al_2O_3$) and hydrogen peroxide ($H_2O_2$).

Figure 5:
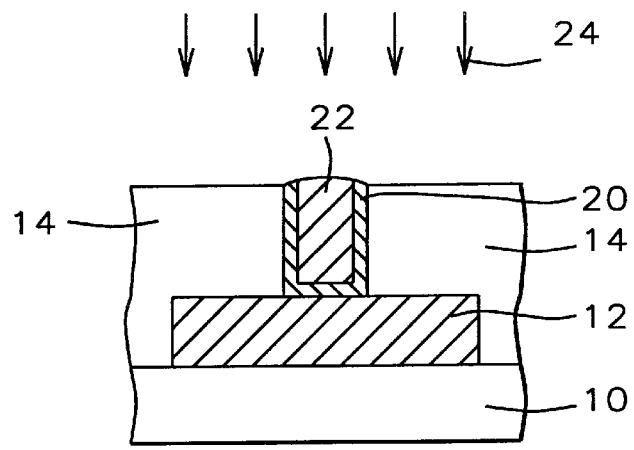

Referring to FIG. 5, the metal plugs 22, which are essentially planar with the surface of the insulating layer 14, are now completed by selectively removing the organic protective layer 16. The preferred method for removing the polymer layer 16 is by plasma ashing in $O_2$, as depicted by the vertical arrows 24. Alternatively, a wet cleaning in a solution of ACT-690 can be included to further clean the substrate surface.

Referring to FIGS. 6–9, the method of this invention for forming patterned multilevels of metal interconnections using this organic protective layer is now described. The method is similar to the process for making the metal plugs.

Figure 6:
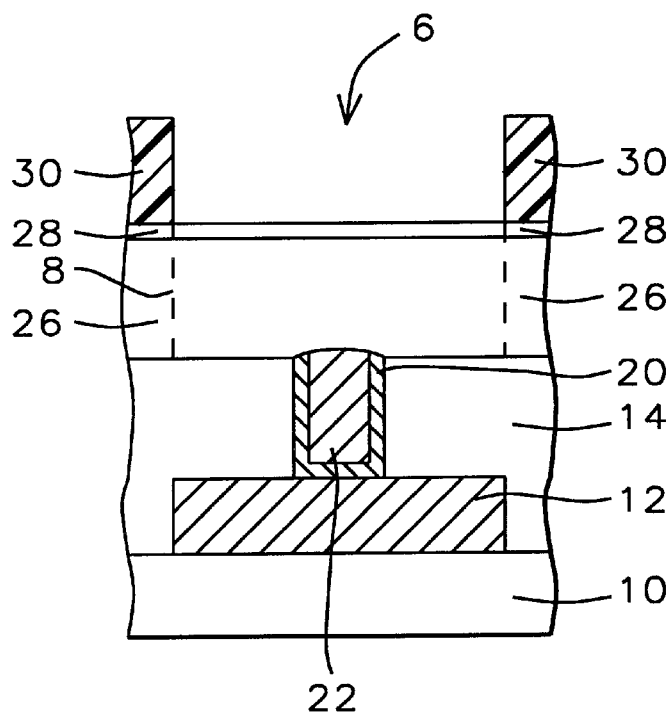
FIGS. 6 through 9 are schematic cross-sectional views showing the sequence of process steps, by the method of this invention, for making metal interconnecting lines over metal plug contacts by chem/mech polishing using an organic protective layer.

Referring now to FIG. 6, a second insulating layer 26 is deposited over the metal plugs 22. The second insulating layer is similar to the insulating layer 14, composed of $SiO_2$ or FSG, and is deposited to a thickness of between about 5000 and 10000 Angstroms. Another disposable organic protective layer 28 is deposited, for example by spin coating. The second protective layer 28 is also a fluorine-doped polymer, such as FLARE(™), and is deposited to a thickness of between about 500 and 1000 Angstroms.

Still referring to FIG. 6, a photoresist mask 30 and anisotropic plasma etching are used to etch trenches or recesses 6 in the second protective layer 28 and the second insulating layer 26. The etching can be carried out using reactive ion etching and an etchant gas such as $CF_4$, $CHF_3$, $CH_3F$, and $N_2$. The trenches extend over the metal plugs 22 in which the next level of metal interconnections are formed, as indicated by the dashed line 8 in FIG. 6.

Figure 7:
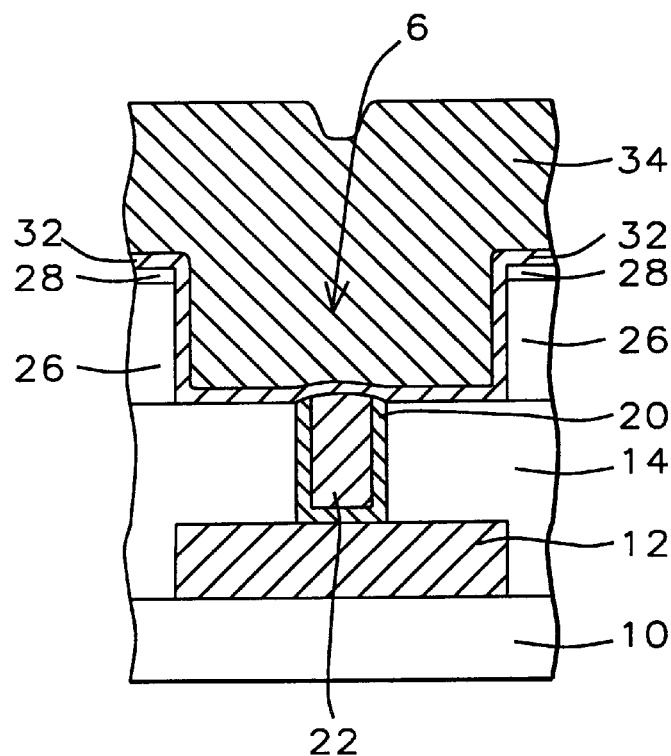

Referring to FIG. 7, the photoresist mask 30 is removed selectively to the organic protective layer 28 using a solvent such as NOE or ACT-690 without attacking the low-dielectric polymer layer 26. Next, a second barrier/adhesion layer 32, such as Ti/TiN, is deposited when using aluminum/copper (AlCu) as the high-conductivity metal, and a barrier/adhesion layer, such as tantalum/tantalum nitride (Ta/TaN), is deposited when using Cu as the high-conductivity metal. The Ti/TiN barrier/adhesion layer 32 is preferably deposited having a Ti thickness of between about 100 and 400 Angstroms, and a TiN thickness of between about 100 and 1000 Angstroms. The Ta/TaN barrier/adhesion layer 32 is preferably deposited having a Ta thickness of between about 200 and 400 Angstroms, and a TaN thickness of between about 200 and 400 Angstroms. Next, a metal layer 34 having high electrical conductivity, such as aluminum/copper alloy or pure copper, is deposited sufficient to fill the trenches 6 and to form an essentially planar surface over the trenches. When AlCu is used for the metal layer 34, the preferred method for deposition is by physical vapor deposition. When the metal layer 34 is Cu, the preferred deposition is to deposit a Cu seed layer and to use electroplating for the bulk fill. Typically the metal layer 34 is formed to a thickness of between about 6000 and 12000 Angstroms.

Figure 8:
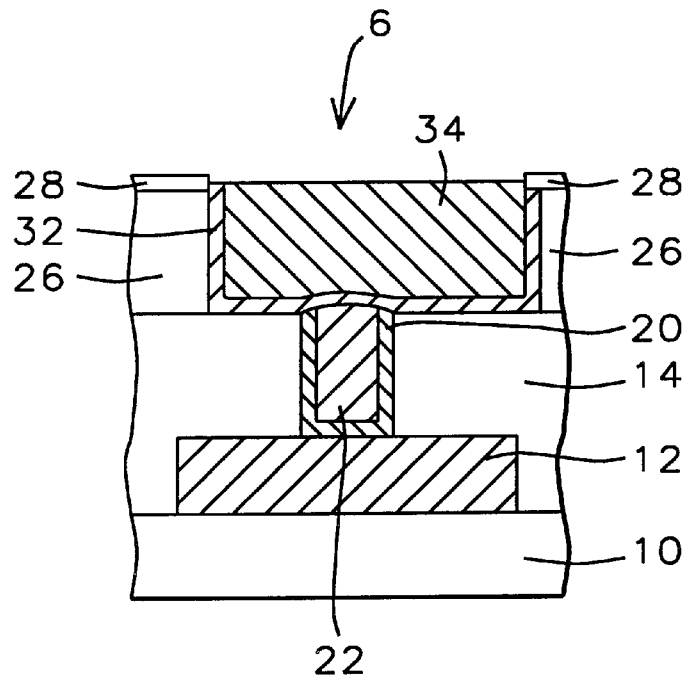

Referring to FIG. 8, the metal layer 34 and the barrier/adhesion layer 32 are then chemically/mechanically polished back to the organic protective layer 28 to form the AlCu or Cu interconnecting metal lines 34 in the trenches 6. The second organic protective layer 28 protects the second insulating layer 26 from polishing-induced defects, such as microscratches. The chem/mech polishing is carried out using an appropriate polishing pad and slurry, for example, one can use a slurry composed of $Al_2O_3$ and $H_2O_2$.

Figure 9:
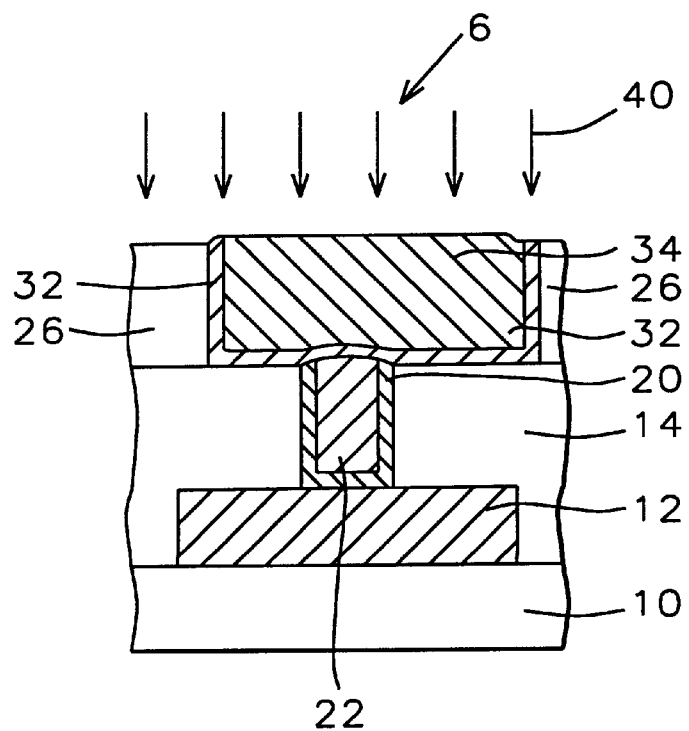

Referring to FIG. 9, the interconnecting metal lines 34, which are essentially planar with the surface of the second insulating layer 26, are now completed by selectively removing the organic protective layer 28. The preferred method for removing the polymer layer 28 is by plasma ashing in $O_2$, as depicted by the vertical arrows 40. Alternatively, a wet cleaning in a solution of ACT-690 can be included to further clean the substrate surface.

The above processes for making the metal plugs and interconnecting lines can be repeated to complete the wiring for the ULSI circuit. Although the method is shown for a single damascene process for each level, it should be understood by those skilled in the art that the process using this organic protective layer can also be applied to the dual damascene process in which the metal plug openings and the trenches for the interconnecting lines are etched before filling with metal and chem/mech polishing.

While the invention has been particularly shown and described with reference to the preferred embodiment thereof, it will be understood by those skilled in the art that various changes in form and detail may be made without departing from the spirit and scope of the invention.

What is claimed is:

1. A method for making recessed patterned metal structures in an insulating layer by chemical/mechanical polishing comprising the steps of:

providing a semiconductor substrate having semiconductor devices;

forming a planar insulating layer composed of silicon oxide on said substrate;

depositing an organic protective layer on said insulating layer;

etching recesses in said organic protective layer and in said insulating layer;

depositing a conformal barrier/adhesion layer on said organic protective layer and in said recesses;

depositing a metal layer sufficiently thick to fill said recesses and to form an essentially planar surface;

chemically/mechanically polishing back said metal layer and said barrier layer to said organic protective layer, wherein said organic protective layer protects said insulating layer from polishing-induced defects;

removing selectively said organic protective layer to said insulating layer to complete said patterned metal structures, coplanar with top surface of said insulating layer.

2. The method of claim 1, wherein said insulating layer is deposited to a thickness of between about 50 and 2000 Angstroms.

3. The method of claim 1, wherein said insulating layer composed of silicon oxide is a fluorine-doped silicon glass (FSG) and having a thickness of between about 5000 and 10000 Angstroms.

4. The method of claim 1, wherein said organic protective layer is fluorine-doped polymer deposited by spin coating to a thickness of between about 500 and 1000 Angstroms.

5. The method of claim 1, wherein said barrier/adhesion layer is a multilayer of titanium and titanium nitride and is deposited to a total thickness of between about 200 and 1000 Angstroms.

6. The method of claim 1, wherein said recesses are contact openings for metal plugs and said metal layer is tungsten (W).

7. The method of claim 1, wherein said recesses are trenches for metal interconnections and said metal layer is aluminum/copper.

8. The method of claim 1, wherein said recesses are trenches for metal interconnections and said metal layer is copper.

9. The method of claim 1, wherein said chemical/mechanical polishing is carried out using a polishing slurry composed of aluminum oxide and hydrogen peroxide.

10. The method of claim 1, wherein said organic protective layer is removed selectively by plasma ashing in oxygen and wet cleaning in a solution of ACT-690, manufactured by Ashland Chemical, U.S.A.

11. A method for making recessed patterned metal interconnections in an insulating layer by chemical/mechanical polishing comprising the steps of:

providing a semiconductor substrate having semiconductor devices;

forming a planar insulating layer composed of silicon oxide on said substrate;

depositing an organic protective layer on said insulating layer;

etching recesses in said organic protective layer and in said insulating layer;

depositing a conformal barrier/adhesion layer on said organic protective layer and in said recesses;

depositing a metal layer sufficiently thick to fill said recesses and to form an essentially planar surface;

chemically/mechanically polishing back said metal layer and said barrier layer to said organic protective layer, wherein said organic protective layer protects said insulating layer from polishing-induced defects;

removing selectively said organic protective layer to said insulating layer to complete said patterned metal interconnections, coplanar with top surface of said insulating layer.

12. The method of claim 11, wherein said insulating layer is deposited to a thickness of between about 50 and 2000 Angstroms.

13. The method of claim 11, wherein said insulating layer composed of silicon oxide is a fluorine-doped silicon glass (FSG) and having a thickness of between about 5000 and 10000 Angstroms.

14. The method of claim 11, wherein said organic protective layer is fluorine-doped polymer deposited by spin coating to a thickness of between about 500 and 1000 Angstroms.

15. The method of claim 11, wherein said barrier/adhesion layer is a multilayer of titanium and titanium nitride and is deposited to a total thickness of between about 200 and 1000 Angstroms, and said metal layer is aluminum/copper.

16. The method of claim 11, wherein said barrier/adhesion layer is a multilayer of tantalum and tantalum nitride and is deposited to a total thickness of between about 200 and 600 Angstroms, and said metal layer is copper.

17. The method of claim 11, wherein said chemical/mechanical polishing is carried out using a polishing slurry composed of aluminum oxide and hydrogen peroxide.

18. The method of claim 11, wherein said organic protective layer is removed selectively by plasma ashing in oxygen and wet cleaning in a solution of ACT-690 manufactured by Ashland Chemical of U.S.A.

19. A method for making metal plugs in an insulating layer by chemical/mechanical polishing comprising the steps of:

providing a semiconductor substrate having a patterned conducting layer on its surface;

forming a planar insulating layer composed of silicon oxide on said patterned conducting layer;

depositing an organic protective layer on said insulating layer;

etching openings for said metal plugs in said organic protective layer and in said insulating layer to said conducting layer;

depositing a conformal barrier/adhesion layer on said organic protective layer and in said openings;

depositing a metal layer sufficiently thick to fill said openings and to form an essentially planar surface;

chemically/mechanically polishing back said metal layer and said barrier layer to said organic protective layer, wherein said organic protective layer protects said insulating layer from polishing-induced defects;

removing selectively said organic protective layer to said insulating layer to complete said metal plugs in said openings, said metal plugs coplanar with said insulating layer.

20. The method of claim 19, wherein said patterned conducting layer is a metal layer having a thickness of between about 3000 and 12000 Angstroms.

21. The method of claim 19, wherein said patterned conducting layer is a polycide composed of a doped polysilicon layer with a refractory metal silicide layer on its surface, and having a total thickness of between about 1000 and 3000 Angstroms.

22. The method of claim 19, wherein said insulating layer is deposited to a thickness of between about 50 and 2000 Angstroms.

23. The method of claim 19, wherein said insulating layer composed of silicon oxide is a fluorine-doped silicon glass (FSG) and having a thickness of between about 5000 and 10000 Angstroms.

24. The method of claim 19, wherein said organic protective layer is fluorine-doped polymer deposited by spin coating to a thickness of between about 500 and 1000 Angstroms.

25. The method of claim 19, wherein said barrier/adhesion layer is a multilayer of titanium and titanium nitride and is deposited to a total thickness of between about 200 and 1000 Angstroms.

26. The method of claim 19, wherein said metal layer is tungsten (W).

27. The method of claim 19, wherein said chemical/mechanical polishing is carried out using a polishing slurry composed of aluminum oxide and hydrogen peroxide.

28. The method of claim 19, wherein said organic protective layer is removed selectively by plasma ashing in oxygen and wet cleaning in a solution of ACT-690 manufactured by Ashland Chemical of U.S.A.

* * * * *